(12) United States Patent
Nielsen et al.

(10) Patent No.: US 9,669,427 B2
(45) Date of Patent: Jun. 6, 2017

(54) METHODS AND SYSTEMS FOR ULTRASOUND CONTROL WITH BI-DIRECTIONAL TRANSISTOR

(75) Inventors: Max E. Nielsen, Orting, WA (US); Ricky D. Jordanger, Allen, TX (US); Ismail H. Oguzman, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1475 days.

(21) Appl. No.: 13/357,593

(22) Filed: Jan. 24, 2012

(65) Prior Publication Data

US 2013/0188457 A1  Jul. 25, 2013

(51) Int. Cl.
*H04B 1/06* (2006.01)
*H04B 1/02* (2006.01)
*B06B 1/02* (2006.01)
*H01L 27/06* (2006.01)

(52) U.S. Cl.
CPC ........ *B06B 1/0215* (2013.01); *H01L 27/0635* (2013.01)

(58) Field of Classification Search
CPC . H04B 11/00; G01S 1/72; G01S 7/527; G01S 3/802; G01V 1/001
USPC ........................................................ 367/135
See application file for complete search history.

(56) References Cited

U.S. PATENT DOCUMENTS

| | | | |
|---|---|---|---|
| 3,958,127 A * | 5/1976 | Faulhaber et al. | 250/559.49 |
| 4,019,069 A * | 4/1977 | Zambuto et al. | 327/405 |
| 4,742,249 A * | 5/1988 | Alpaiwalla et al. | 327/484 |
| 4,755,697 A | 7/1988 | Kinzer | |
| 4,812,770 A * | 3/1989 | Dravkin | 327/300 |
| 4,903,280 A * | 2/1990 | Lang et al. | 375/220 |
| 4,961,100 A * | 10/1990 | Baliga et al. | 257/172 |
| 5,414,378 A * | 5/1995 | Edgar et al. | 327/143 |
| 5,420,451 A | 5/1995 | Williams et al. | |
| 5,451,533 A | 9/1995 | Williams et al. | |
| 5,510,747 A | 4/1996 | Williams | |
| 5,592,031 A * | 1/1997 | Ramos Fernandez et al. | 307/112 |
| 5,612,566 A | 3/1997 | Williams | |
| 5,731,732 A | 3/1998 | Williams | |

(Continued)

FOREIGN PATENT DOCUMENTS

JP   A-H08-23098 A   1/1996
JP   A-H08-37303 A   2/1996

(Continued)

OTHER PUBLICATIONS

Sedra et al., Microelectronic Circuits, 5.1 Structure and Physical Operation of the Enhancement-Type MOSFET, Oxford University Press 1998, Fourth Edition, pp. 354-357.

(Continued)

*Primary Examiner* — Luke Ratcliffe
*Assistant Examiner* — Amie M N'Dure
(74) *Attorney, Agent, or Firm* — Tuenlap D. Chan; Charles A. Brill; Frank D. Cimino

(57) ABSTRACT

In at least some embodiments, an ultrasound system includes an ultrasound transducer and a bi-directional transistor coupled to the ultrasound transducer. The ultrasound system also includes an ultrasound receiver coupled to the bi-directional transistor. The bi-directional transistor operates to selectively connect the ultrasound transducer to ground and to selectively connect the ultrasound transducer to the ultrasound receiver.

6 Claims, 5 Drawing Sheets

(56) References Cited

U.S. PATENT DOCUMENTS

| | | | |
|---|---|---|---|
| 5,909,139 A | 6/1999 | Williams | |
| 6,540,677 B1* | 4/2003 | Angelsen et al. | 600/437 |
| 6,759,888 B1 | 7/2004 | Wodnicki | |
| 6,813,181 B1* | 11/2004 | Viehmann et al. | 365/158 |
| 6,956,426 B2* | 10/2005 | Wodnicki | 327/382 |
| 7,314,445 B2 | 1/2008 | Wodnicki et al. | |
| 7,351,204 B2* | 4/2008 | Amemiya | 600/437 |
| 7,561,812 B2* | 7/2009 | Tai et al. | 398/202 |
| 7,847,633 B2* | 12/2010 | Kinget | 330/253 |
| 8,193,683 B2* | 6/2012 | Oguzman et al. | 310/317 |
| 8,193,839 B2* | 6/2012 | Ko et al. | 327/112 |
| 8,721,550 B2* | 5/2014 | Oguzman et al. | 600/459 |
| 2002/0070805 A1* | 6/2002 | Ausserlechner et al. | 330/264 |
| 2002/0135415 A1 | 9/2002 | Dufort | |
| 2003/0107987 A1* | 6/2003 | Kinstler | 370/228 |
| 2003/0222535 A1* | 12/2003 | Gofman et al. | 310/316.01 |
| 2004/0113669 A1* | 6/2004 | Wodnicki | 327/170 |
| 2004/0227556 A1* | 11/2004 | Ohmori | 327/309 |
| 2005/0139931 A1* | 6/2005 | Arai | 257/370 |
| 2006/0092677 A1* | 5/2006 | Moussaoui et al. | 363/71 |
| 2007/0027508 A1* | 2/2007 | Cowan | 607/61 |
| 2007/0279094 A1* | 12/2007 | Jiang | 326/83 |
| 2008/0116751 A1* | 5/2008 | Kihara et al. | 307/113 |
| 2009/0206676 A1* | 8/2009 | Chu et al. | 307/106 |
| 2011/0063011 A1* | 3/2011 | Barlow | 327/328 |

FOREIGN PATENT DOCUMENTS

| | | |
|---|---|---|
| JP | A-2005-193036 A | 7/2005 |
| JP | 2007-088550 | 4/2007 |

OTHER PUBLICATIONS

PCT Notification of First Office Action Issue Date:Sep. 5, 2016.

Japanese Notification of First Office Action, Mail date: Oct. 20, 2016.

* cited by examiner

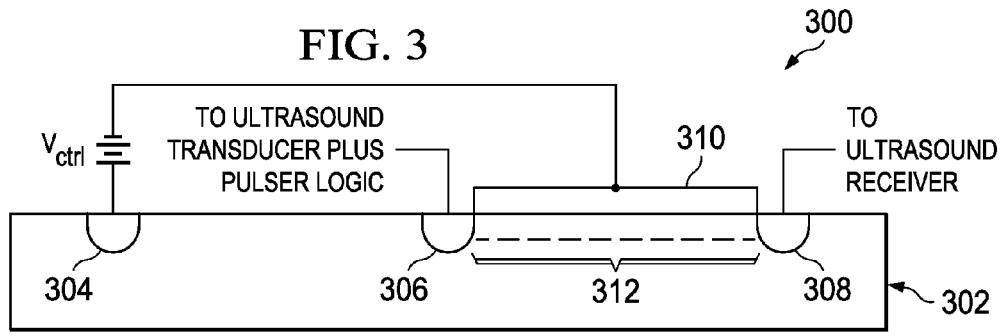
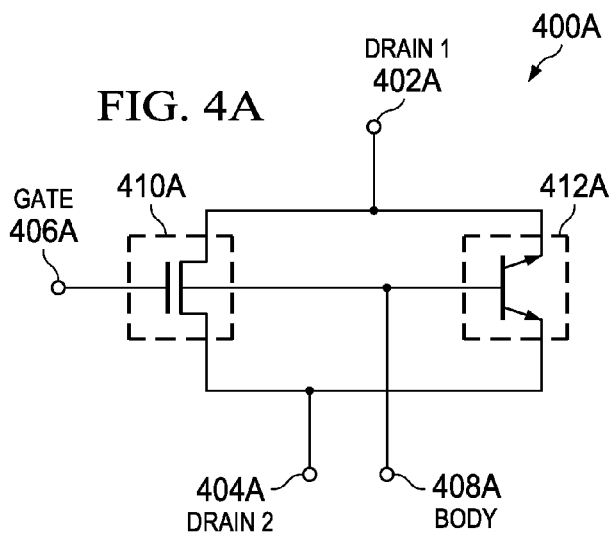
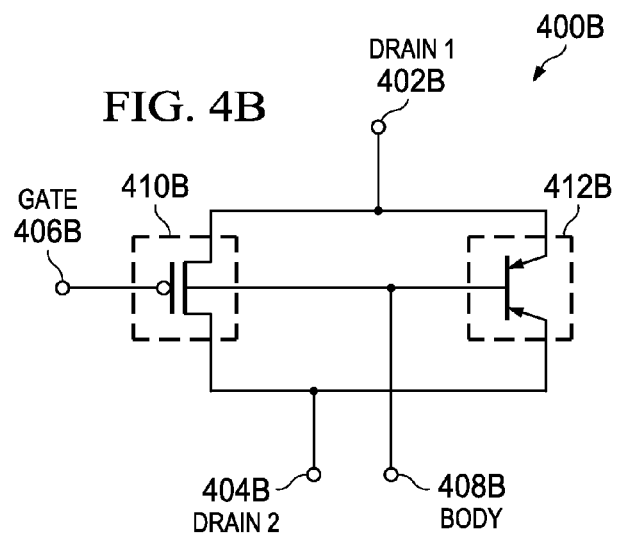

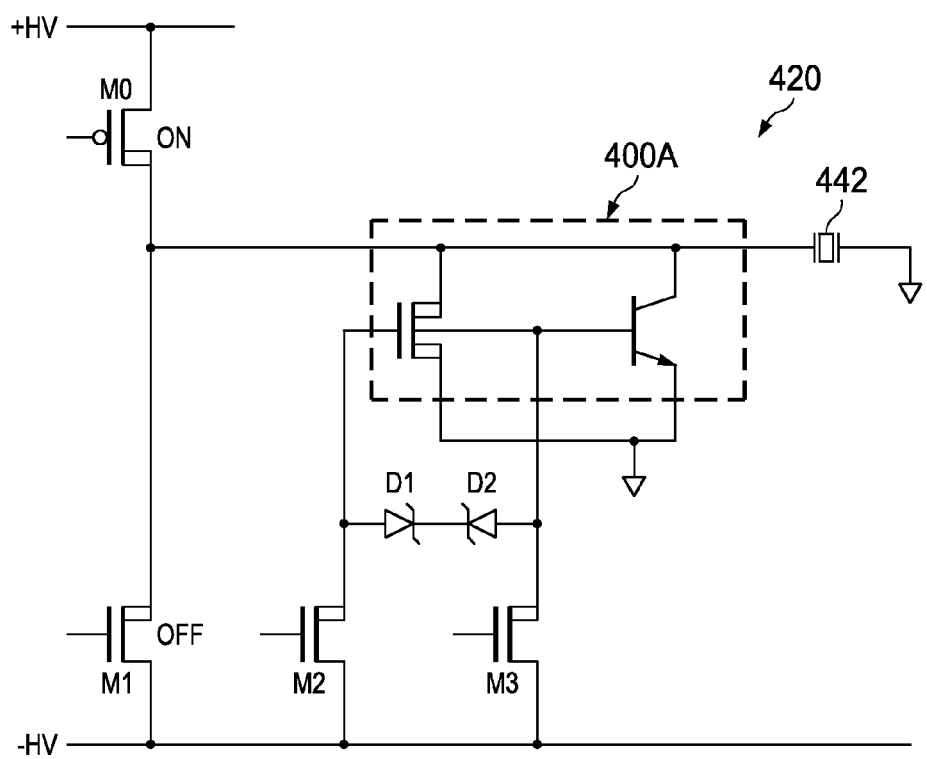
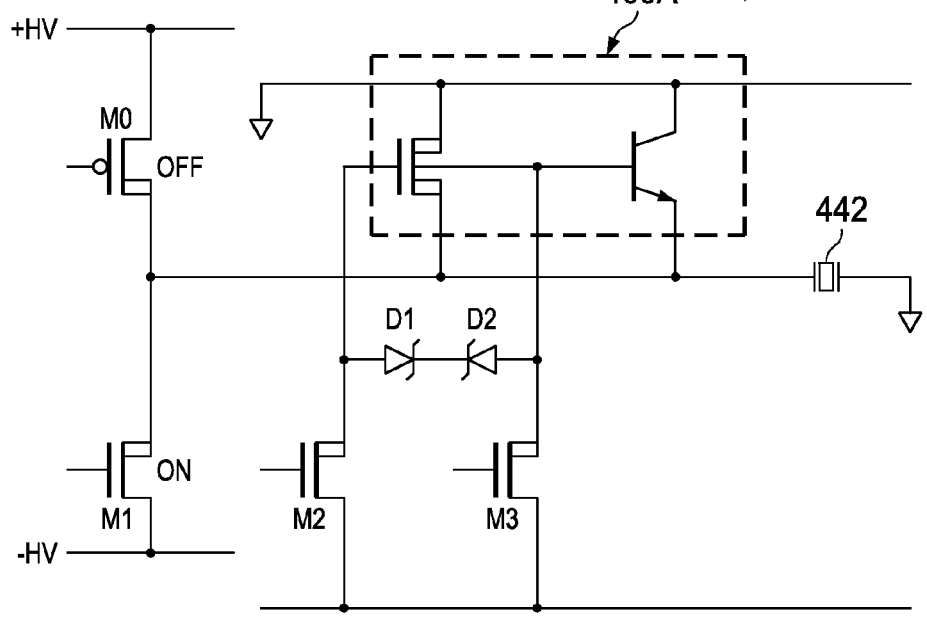

METHODS AND SYSTEMS FOR ULTRASOUND CONTROL WITH BI-DIRECTIONAL TRANSISTOR

BACKGROUND

Many electronic devices implement semiconductor transistors to control the flow of electricity without mechanical moving parts. Semiconductor transistors may vary with respect to materials used, architecture, operational range for voltage and current, and size. The implementation of semiconductor transistors into electrical devices is ongoing and improvements to semiconductor transistor design, reliability, and efficiency are continually being sought.

SUMMARY

In at least some embodiments, an ultrasound system includes an ultrasound transducer and a bi-directional transistor coupled to the ultrasound transducer. The bi-directional transistor operates to selectively connect the ultrasound transducer to ground and to selectively connect the ultrasound transducer to the ultrasound receiver.

In accordance with at least some embodiments, a control chip for an ultrasound device a bi-directional transistor and an ultrasound transducer connection pin coupled to the bi-directional transistor. The control chip also includes an ultrasound receiver connection pin coupled to the bi-directional transistor. The bi-directional transistor enables current to selectively flow from the ultrasound transducer connection pin to the ultrasound receiver connection pin.

In accordance with at least some embodiments, a method includes activating, by control logic, a pulse mode during which a high voltage level is provided to a transducer while a bi-directional transistor coupled to an ultrasound receiver is off. The method also includes activating, by the control logic, a return-to-zero (RTZ) mode during which a grounding transistor switch is on while the bi-directional transistor is on. The method also includes activating, by the control logic, a listen mode during which the grounding transistor switch is off while the bi-directional transistor is on

BRIEF DESCRIPTION OF THE DRAWINGS

For a detailed description of exemplary embodiments of the invention, reference will now be made to the accompanying drawings in which:

FIG. 3 illustrates a bi-directional transistor architecture in accordance with an embodiment of the disclosure;

Figure 4E:
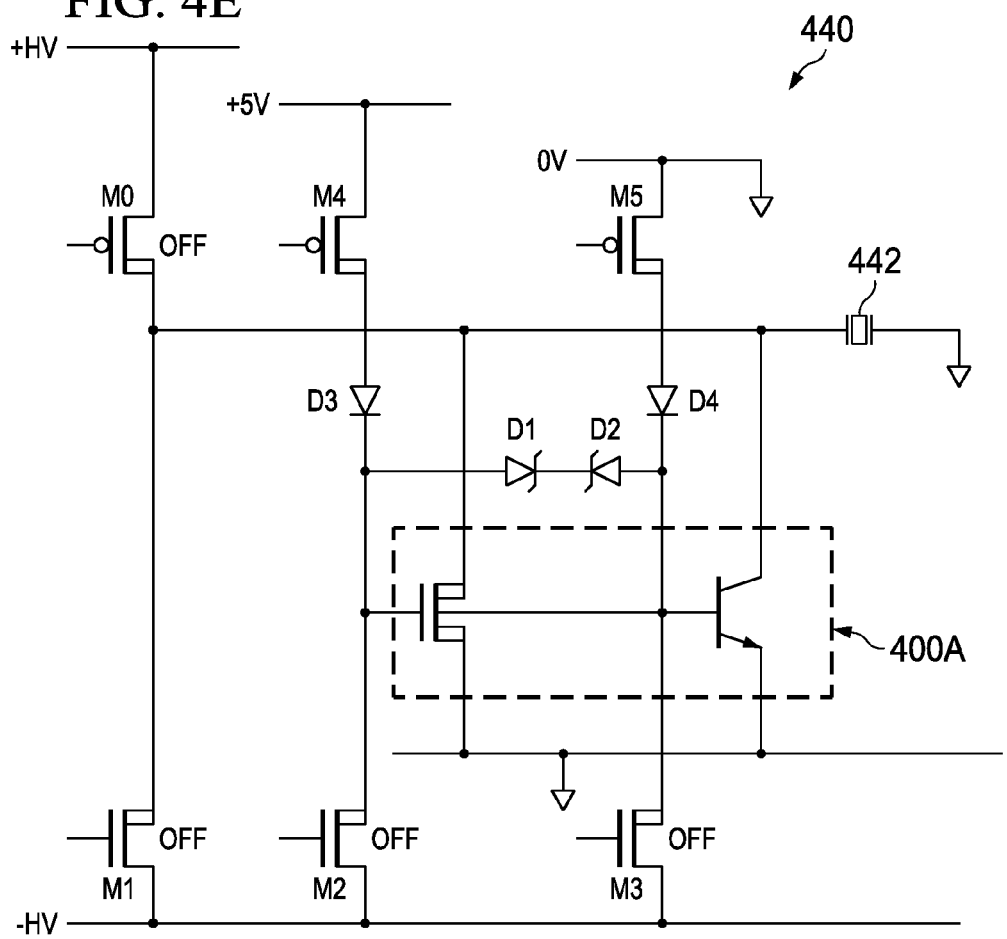
FIG. 4A illustrates a NMOS bi-directional transistor representation in accordance with an embodiment of the disclosure.
Figure 4F:
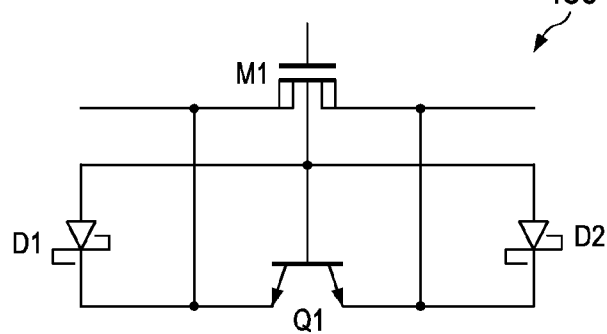
Figure 5:
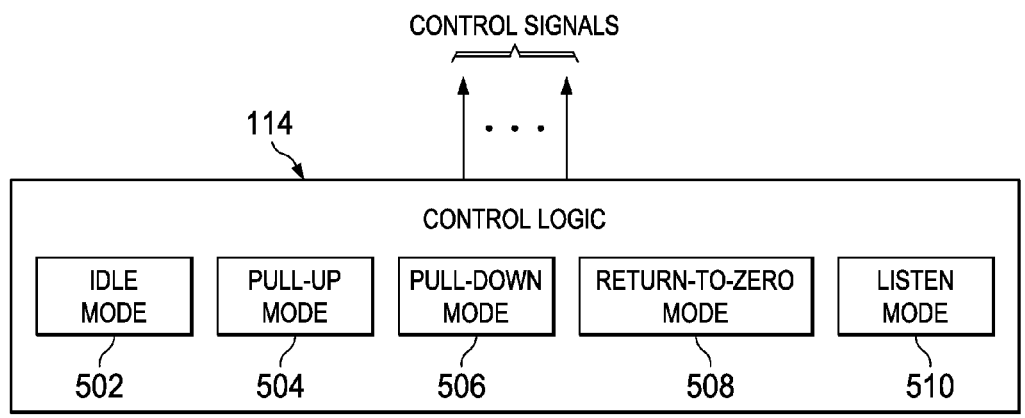
Figure 6:
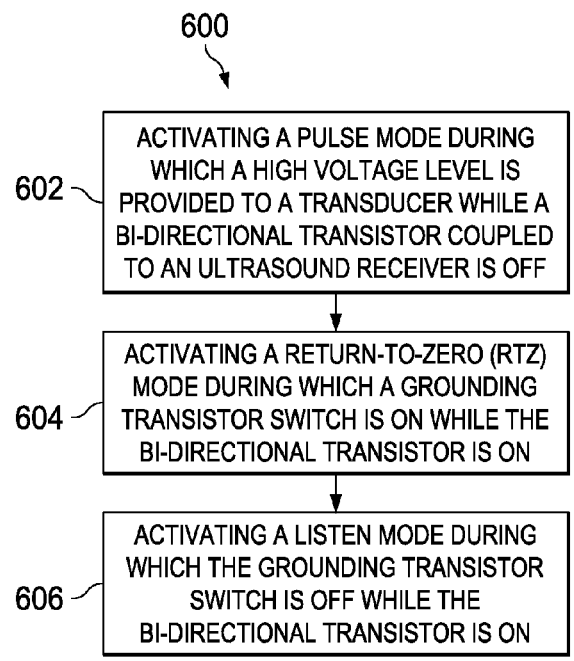

symbol in accordance;

FIG. 4B illustrates a PMOS bi-directional transistor representation in accordance with an embodiment of the disclosure;

FIG. 4C illustrates an upward slew scenario with the NMOS bi-directional transistor representation of FIG. 4A turned off in accordance with an embodiment of the disclosure;

FIG. 4D illustrates a downward slew scenario with the NMOS bi-directional transistor representation of FIG. 4A turned off in accordance with an embodiment of the disclosure;

FIG. 4E illustrates a switch on scenario for the NMOS bi-directional transistor representation of FIG. 4A in accordance with an embodiment of the disclosure;

FIG. 4F illustrates a body potential control scheme for the NMOS bi-directional transistor representation of FIG. 4A in accordance with an embodiment of the disclosure;

FIG. 5 illustrates control logic for an ultrasound device in accordance with an embodiment of the disclosure; and FIG. 6 illustrates a method in accordance with an embodiment of the disclosure.

DETAILED DESCRIPTION

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The term "system" refers to a collection of two or more hardware and/or software components, and may be used to refer to an electronic device or devices or a sub-system thereof. Further, the term "software" includes any executable code capable of running on a processor, regardless of the media used to store the software. Thus, code stored in non-volatile memory, and sometimes referred to as "embedded firmware," is included within the definition of software.

Embodiments are directed to a specialized transistor architecture and its use, for example, in an ultrasound system. In at least some embodiments, the transistor comprises a high-voltage metal-oxide-semiconductor field-effect transistor (MOSFET) equipped with high-voltage drains at both ends of the channel. The body of the transistor is not tied to the source (as is commonly done in high-voltage MOSFETs). These features allow the device to conduct current and stand off high voltages in either direction. The channel conductivity for the disclosed MOSFET architecture is controlled by varying the gate potential relative to the body, and by controlling both the body and gate potentials relative to those of the ultrasound transducer and receiver (when used as transmitter/receiver switch) or transmitter and ground (when used as a dynamic damping switch). The disclosed transistor architecture requires no current to maintain a steady, high conductance path and thus is advantageous compared to implementing a diode bridge. Further, the disclosed transistor architecture requires potentially uses less area than implementing two series MOSFET switches. The disclosed transistor architecture may be implemented as a low-power transistor/receiver (T/R) switch for ultrasound transmitters, or may be implemented in integrated circuits (ICs) which benefit from a T/R switch and/or a dynamic damping switch.

Without limitation, the development of the disclosed transistor architecture was intended to provide an easily controlled, compact switch for discharging an ultrasound transducer toward ground (e.g., for dynamic damping) or for connecting a transducer to an ultrasound receiver (e.g., for T/R switch operations such as afterpulsing). A conventional high-voltage MOSFET has a high-voltage drain at one end of its channel and a low-voltage source at the other end. For this conventional MOSFET architecture, channel conduction is controlled by varying the gate potential relative to its source. By comparison, the disclosed transistor architecture comprises a high-voltage drain at each end of its channel. For the disclosed transistor architecture, channel conduction is controller by varying the gate potential relative to the body. This allows the disclosed transistor architecture to operate bi-directionally. More specifically, with a sufficient positive gate-to-body voltage the MOSFET (assumed in this case to be an NMOS device) can conduct in either direction. The bi-directional operation of the disclosed transistor architecture may support as high a potential as the drain structures permit. With sufficient low or negative gate-to-body potential, the MOSFET will conduct no steady-state current.

Figure 2:
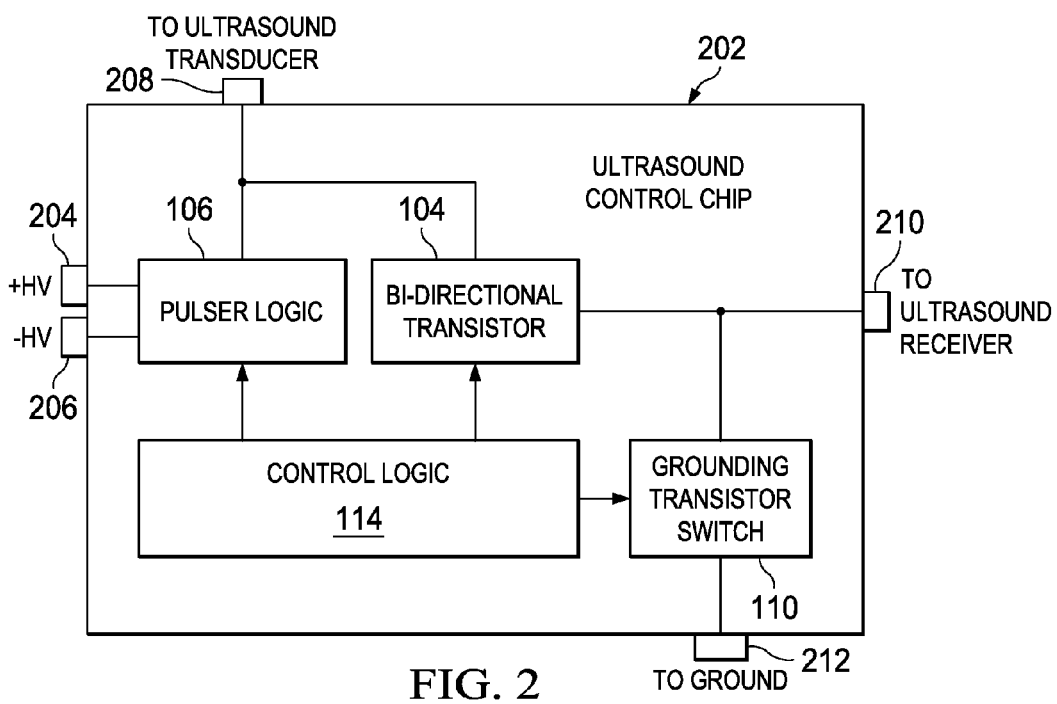
FIG. 2 illustrates an ultrasound control chip in accordance with an embodiment of the disclosure.

FIG. 2 illustrates an ultrasound device 102 in accordance with an embodiment of the disclosure. As shown, the ultrasound device 102 comprises an ultrasound transducer 108 that is selectively operated by pulser logic 106 to generate an ultrasound wave. More specifically, the pulser logic 106 may comprise a pull-up transistor switch that selectively provides a high positive voltage to the ultrasound transducer 108. Additionally or alternatively, the pulser logic 106 may comprise a pull-down transistor switch that selectively provides a high negative voltage to the ultrasound transducer 108. The operation of the pulser logic 106 to provide a high positive voltage or a high negative voltage is controlled by control logic 114. In accordance with at least some embodiments, the control logic 114 directs the pulser logic 106 to output a high positive voltage, a high negative voltage, or a sequence of high positive voltages and/or low negative voltages. The output of the pulser logic 106 actuates the ultrasound transducer 108 to produce one or more ultrasound waves. During the actuation of the ultrasound transducer 108 by the pulser logic 106, the bi-directional transistor 104 is off.

After actuation of the ultrasound transducer 108 by the pulser logic 106, the control logic 114 may ground the ultrasound transducer 108 by turning the pulser logic 106 off, turning the bi-directional transistor 104 on and turning the grounding transistor switch 110 on. After the ultrasound transducer 108 is grounded, the control logic 114 enables a listening mode for the ultrasound device 102, where the pulser logic 106 is off, the bi-directional transistor 104 is on, and the grounding transistor switch 110 is off. In the listening mode, reflected ultrasound waves cause the ultrasound transducer 108 to generate corresponding electrical signals that are forwarded to the ultrasound receiver 112 for analysis and/or imaging.

To summarize, the ultrasound device 102 has different operational modes during which the pulser logic 106, the bi-directional transistor 104 and the grounding transistor switch 110 are on or off. During an idle mode, for example, the control logic 114 causes the pulser logic 106 to be off, while the bi-directional transistor 104 and the grounding transistor switch 110 are on. During a pull-up mode, the control logic 114 causes a pull-up transistor of the pulser logic 106 to be turned on (the pull-down transistor is turned off), while the bi-directional transistor 104 and the grounding transistor switch 110 are off. During a pull-down mode, the control logic 114 causes a pull-down transistor of the pulser logic 106 to be turned on (the pull-up transistor is turned off), while the bi-directional transistor 104 and the grounding transistor switch 110 are off. The pull-up modes and the pull-down modes actuate the ultrasound transducer 108 causing an ultrasound wave to be generated. During a return-to-zero (RTZ) mode, the control logic 114 causes the pulser logic 106 to be off, while the bi-directional transistor 104 and the grounding transistor switch 110 are on. During a listen mode, the control logic 114 causes the pulser logic 106 and the grounding transistor switch 110 to be off, while the bi-directional transistor 104 is on. The RTZ mode prepares the ultrasound transducer 108 for the listen mode during which the ultrasound transducer 108 generates electrical signals from reflected ultrasound waves and forwards these electrical signals to the ultrasound receiver 112 via the bi-directional transistor 104.

As will later be described, the bi-directional transistor 104 may comprise a channel with a high-voltage drain at each end of the channel. In such embodiments, the current flow for the bi-directional transistor 104 is controlled by varying a gate-to-body voltage potential level. Accordingly, for the different control modes described herein, the control logic 114 may selectively turn the bi-directional transistor 104 on and off by changing the gate-to-body voltage potential.

In at least some embodiments, various components of the ultrasound device 102 are implemented together on a semiconductor chip. For example, the pulsar logic and the bi-directional transistor may be fabricated as components of a single semiconductor control chip. FIG. 2 illustrates an ultrasound control chip 200 in accordance with an embodiment of the disclosure. As shown, the ultrasound control chip 200 comprises the pulser logic 106, the bi-directional transistor 104, the grounding transistor switch 110, and the control logic 114. In alternative embodiments, the control logic 114 and/or the grounding transistor switch 110 are omitted from the ultrasound control chip 202.

As shown in FIG. 2, the ultrasound control chip 202 comprises various pins (204-212) to connect internal components of the chip 202 with external ultrasound components. For example, a high positive voltage connection pin 204 enables an external high positive voltage to be input to the pulser logic 106. Further, a high negative voltage connection pin 206 enables an external high positive voltage to be input to the pulser logic 106. As shown, the ultrasound control chip 202 also comprises an ultrasound transducer connection pin 208 to connect internal components (e.g., pulser logic 106 and bi-directional transistor 104) of the ultrasound control chip 208 to an ultrasound transducer (e.g., ultrasound transducer 108). The ultrasound control chip 202 also comprises an ultrasound receiver connection pin 210 to connect internal components (e.g., bi-directional transistor 104 and grounding transistor switch 110) of the ultrasound control chip 208 to an ultrasound receiver (e.g., ultrasound receiver 112). As shown, the ultrasound control chip 202 also comprises a ground connection pin 212 to connect the grounding transistor switch 110 to ground.

The internal components and connection pins of the ultrasound control chip 202 are examples only and are not intended to limit other embodiments. For example, in ultrasound control chip embodiments where the control logic 114 is external to the chip, additional connection pins would be provided to connect signals from the control logic 114 to the pulser logic 106, to the bi-directional transistor 104 and/or to the grounding transistor switch 110. Similarly, in ultrasound control chip embodiments where the grounding transistor switch 110 is external to the chip, a grounding transistor switch connection pin may be used to connect an external grounding transistor switch between the bi-directional transistor 104 and the ultrasound receiver connection pin 210.

In operation, the bi-directional transistor 104 of ultrasound control chip 202 enables current to selectively flow from the ultrasound transducer connection pin 208 to the ultrasound receiver connection pin 210. During a pull-up control mode, the pulser logic 106 provides a high positive voltage level to the ultrasound transducer connection pin 108 while the bi-directional transistor 104 is off. During a pull-down control mode, the pulser logic 106 provides a high negative voltage level to the ultrasound transducer connection pin 208 while the bi-directional transistor 104 is off. During a return-to-zero (RTZ) control mode, the bi-directional transistor 104 is on and the output of the ultrasound receiver connection pin 210 is grounded (by turning the internal or external grounding transistor switch 110 on). During a listen control mode, the bi-directional transistor 104 is on and the ultrasound receiver connection pin 210 is not grounded (i.e., the grounding transistor switch 110 is off).

Figure 1:
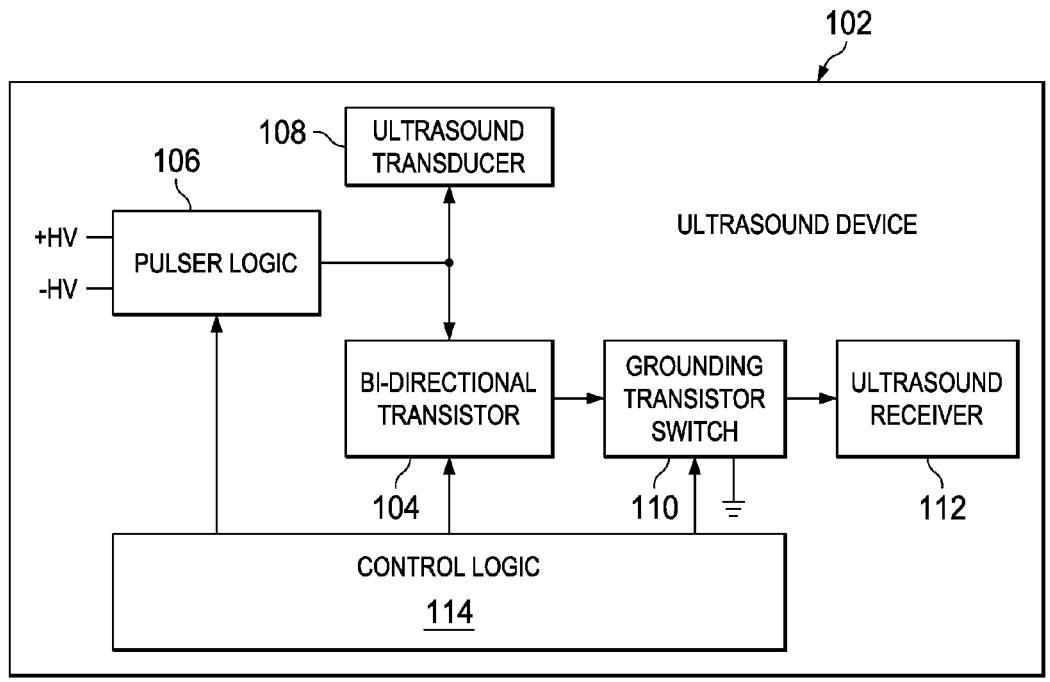
FIG. 1 illustrates an ultrasound device in accordance with an embodiment of the disclosure.

As previously mentioned, in accordance with embodiments, the bi-directional transistor 104 comprises a channel with a high-voltage drain at each end of the channel and channel conduction is controlled by varying a gate-to-body voltage potential level. FIG. 3 illustrates a bi-directional transistor architecture 300 in accordance with an embodiment of the disclosure. The bi-directional transistor architecture 300 of FIG. 3 corresponds to, for example, the bi-directional transistor 104 described for FIGS. 1 and 2.

As shown, the bi-directional transistor architecture 300 comprises a channel 312 and drains 306 and 308 on each end of the channel 312. Above the channel 312 is gate 310, which enables current to flow between the drains 306 and 308 in either direction depending on the value of control voltage ($V_{ctrl}$). $V_{ctrl}$ can also be set so that no current flows between drains 306 and 308. $V_{ctrl}$ is shown in FIG. 3 as the voltage potential between body 304 and gate 310. In accordance with at least some embodiments, the body 304 is "floated" relative to the substrate 302 in/on which the body 304 is built. Isolation or "floating" can be accomplished by buried oxide, by oxide trenches, or by junction isolation. The isolation of the body 304 from the substrate 302 is necessary for the disclosed transistor architecture to function properly.

The bi-directional transistor architecture 300 is "off", for example, when left drain 306 is at a positive voltage (e.g., 30V) while the right drain 308 is at a negative voltage (e.g., −50V). In this situation, the body potential can rise no higher than one diode drop above the drain 308 voltage (i.e., the right drain 308 acts as the source of a conventionally configured MOSFET). $V_{ctrl}$ is used to bias the gate 310 at, for example, −5V below the body 304. In this scenario, the gate 310 is biased to no more than −43V above the "source" and the channel 312 is off. If the voltage on the drain terminals 306 and 308 are reversed, the body 304 would tend to stay only slightly above (by no more than a diode drop) the drain at the lowest potential. Thus, the channel 312 would remain off, at least in a quasi-static sense. The bi-directional transistor architecture 300, the drains 306 and 308 are "n+" and the body 304 is "p−", resulting in bipolar transistor behavior. To shut off bi-polar transistor current flow, the potential at the body 304 is driven down to the drain at the lowest potential.

The bi-directional transistor architecture 300 is "on", for example, when the gate 310 is biased positively with respect to the drain at the lowest potential. The drain 306, 308 with the highest potential serves as a drain in the conventional sense. Reversing the potential at the drains 306, 308 results in conduction as well. The bi-polar transistor behavior is also present. With the potential of the body 304 high relative to the drain at the lowest potential, conventional bi-polar current flows. Because MOSFET action is affected by the potential of the body 304 relative to the lower drain, control of the body 304 potential is useful.

In at least some embodiments, the bi-directional transistor architecture 300 is used as a transmitter/receiver (T/R) switch. In such case, the high voltage from pulser logic causes the formation of a depletion region around the left drain 306. The channel 312 is turned off by applying large enough $V_{ctrl}$ to ensure that the gate 310 is less than $V_{th}$ above the right drain 308. Not shown, but required, is a driver for the body 304 that keeps its potential sufficiently low (relative to the right drain 308) to prevent bi-polar current flow.

$V_{ctrl}$ may also be controlled so that the gate 310 is less than $V_{th}$ above the left drain 306. With a high negative voltage applied by pulser logic, a depletion region forms around the right drain 308. Not shown, but required, is a driver for the body 304 that keeps its potential sufficiently low (relative to the left drain 306) to prevent bi-polar current flow.

FIG. 4A illustrates an NMOS bi-directional transistor representation 400A in accordance with an embodiment of the disclosure. The NMOS bi-directional transistor representation 400A shows a MOSFET 410A and a parasitic NMOS bi-polar device 412A, where the body potential 408A (corresponding to WO is controlled to ensure the action of the bi-polar device 412A is as desired. Also shown are drains 402A and 404A (corresponding to drains 306 and 308) and gate 406A (corresponding to gate 310).

FIG. 4B illustrates a PMOS bi-directional transistor representation 400B in accordance with an embodiment of the invention. The PMOS bi-directional transistor representation 400B shows a MOSFET 410B and a parasitic PMOS bi-polar device 412B, where the body potential 408B (corresponding to WO is controlled to ensure the action of the bi-polar device 412B is as desired. Also shown are drains 40BA and 404B (corresponding to drains 306 and 308) and gate 406B (corresponding to gate 310).

FIG. 4C illustrates an upward slew scenario 420 with the NMOS bi-directional transistor representation 400A of FIG. 4A turned off. For the upward slew scenario 420, M2 and M3 can be turned on to prevent the body/base potential from rising and thereby turning on the MOS and bi-polar device. Meanwhile, the zener diodes D1 and D2 in FIG. 4C prevent any excess gate/body potential. As long as the drain/body junctions (collector/base junctions) withstand a voltage equal to the difference between the high voltage supplies, M2 and M3 can be turned on during active pulsing in either direction. In this manner, the gate and body potentials may be controlled during pulsing.

FIG. 4D illustrates a downward slew scenario 430 with the NMOS bi-directional transistor representation 400A of FIG. 4A turned off. In downward slew scenario 430, for example, the NMOS bi-directional transistor representation 400A is used as a dynamic damping switch. In downward slew scenario 430, if M2 pulls down before M1 or M3 (M1, M2, and M3 are intended would pull down at the same time), then M2 will pull the gate and body down below the drain/source and the collector/emitter terminals of the NMOS bi-directional transistor representation 400A. Because the drain junctions withstand high voltage, they will not break down. Further, the gate can withstand high voltage (and high $V_{sg}$) and thus there will not be a gate breakdown at the drains. The zener diodes D1 and D2 in downward slew scenario 430 prevent breakdown at the gate to the body.

If M1 pulls down before M2 or M3, the body/drain junction of the MOS (the base emitter of the bi-polar structure) is forward biased. The zener diodes D1 and D2 will cause the gate to fall while preventing excess $V_{gb}$ or $V_{gs}$. In order to prevent the NMOS bi-directional transistor representation 400A from conducting during a downward slew, M3 is activated at some point in time. Even if M3 is delayed in turning on, relative to M1, there will be no damage due to junction or gate breakdown.

FIG. 4E illustrates a switch on scenario 440 for the NMOS bi-directional transistor representation 400A of FIG. 4A. To turn the NMOS bi-directional transistor representation 400A on, M4 and M5 (not shown in previous diagrams) are turned on. M4 raises the gate potential to 5V-$V_{be}$, or to the largest practical $V_{gs}$. Meanwhile, M5 raises the body (emitter) to 0V-$V_{be}$ for the purpose of reducing body effect on the MOS device. Were the body (emitter) raised above ground sufficiently the bi-polar structure would turn on and provide a current path between the transducer 442 and ground, but this is not necessary. The bi-polar structure will have low β because its emitter will be highly doped and its base will be thick. Thus, the bi-polar structure will not provide, or is unlikely to provide, a strong conduction path to ground. The MOS structure, however, will provide a strong conduction path to ground without any steady state current. The bi-polar structure base current required to keep the MOS structure turned on is an unwanted dissipation of power.

To summarize, the disclosed transistor architecture comprises a MOS transistor structure and a bi-polar transistor structure. The MOS transistor structure has the following characteristics: 1) the breakdown threshold for $V_{dg}$ and $V_{sg}$ are large (positive for NMOS, negative for PMOS); 2) $V_{gs}$ is turned "on" as needed for strong conduction; 3) $V_{gs}$ is turned "off" as needed to turn off channel; 4) the breakdown threshold for $V_{gb}$ is as high as possible while maintaining good channel conduction. The bi-polar transistor structure has the following characteristics: 1) β is not high; and 2) the breakdown threshold for $V_{cb}$ and $V_{eb}$ is large.

FIG. 4F illustrates a body potential control scheme 450 for the NMOS bi-directional transistor representation 400A of FIG. 4A. In the body potential control scheme 450, Schottky diodes are used to control $V_{be}$ in the disclosed transistor architecture. Mores specifically, diodes D1 and D2 of the body potential control scheme 450 prevent either base-emitter junction from turning on. Thus conduction of current in a standard bi-polar transistor mode is prevented. This simplifies control of the body (base) potential by making M3 of FIGS. 4C-4E unnecessary. The same technique can be applied to the complementary PMOS transistor architecture shown in FIG. 4B. In at least some embodiments, the Schottky diodes have a low forward voltage and withstand reverse voltages consistent with those that the drain/body diodes of M1 (collector/base junctions at Q1) can withstand.

FIG. 5 illustrates control logic 114 for an ultrasound device in accordance with an embodiment of the disclosure. As shown, the control logic 114 comprises idle mode logic 502, pull-up mode logic 504, pull-down mode logic 506, RTZ logic 508 and listen mode logic 510. The idle mode logic 502 causes idle mode control signals to be provided to the pulser logic 106, the bi-directional transistor 104 and the grounding transistor switch 110 as described herein. The pull-up mode logic 504 causes pull-up mode control signals to be provided to the pulser logic 106, the bi-directional transistor 104 and the grounding transistor switch 110 as described herein. The pull-down mode logic 506 causes pull-down mode control signals to be provided to the pulser logic 106, the bi-directional transistor 104 and the grounding transistor switch 110 as described herein. The RTZ mode logic 508 causes RTZ mode control signals to be provided to the pulser logic 106, the bi-directional transistor 104 and the grounding transistor switch 110 as described herein. The listen mode logic 510 causes listen mode control signals to be provided to the pulser logic 106, the bi-directional transistor 104 and the grounding transistor switch 110 as described herein.

The control logic 114 may implemented internally or externally with respect to the ultrasound control chip 202 of FIG. 2. In either case, the control logic 114 may correspond to a processor executing instructions stored by a computer-readable memory accessible to the processor. Alternatively, the control logic 114 may comprise a programmable controller or application specific integrated circuit. The operations of the control logic 114 may correspond to a state machine that steps through the idle mode, the pull-up mode, the pull-down mode, the RTZ mode, and the listen mode in a particular order. In at least some embodiments, the idle mode corresponds to a default mode and the other modes occur as part of an ultrasound sequence. Further, the pull-up mode and the pull-down mode may be part of a pulse mode where a single pull-up operation occurs, a single pull-down operation occurs, or a combination of at least one pull-up operation and at least one pull-down operation occurs. The timing and duration of the different modes for control logic 114 may vary to enable a variety of ultrasound options.

FIG. 6 illustrates a method 600 in accordance with an embodiment of the disclosure. As shown, the method 600 comprises activating a pulse mode during which a high voltage level is provided to a transducer while a bi-directional transistor coupled to an ultrasound receiver is off (block 602). In at least some embodiments, activating the pulse mode comprises providing a high positive voltage level to the transducer while the bi-directional transistor is off and providing a high negative voltage level to the transducer while the bi-directional transistor is off. After the pulse mode, an RTZ mode is activated during which a grounding transistor switch is on while the bi-directional transistor is on (block 604). Finally, a listen mode is activated during which the grounding transistor switch is off while the bi-directional transistor is on (block 606).

In at least some embodiments, the method 600 additionally or alternative may comprises at least one other step. For example, the method 600 may additionally comprise controlling channel conduction for the bi-directional transistor during the pulse mode by setting a gate-to-body voltage potential level to a predetermined value or range. The method 600 may additionally comprise controlling channel conduction for the bi-directional transistor during the RTZ mode by setting a gate-to-body voltage potential level to a predetermined value or range The method 600 may additionally comprise controlling channel conduction for the bi-directional transistor during the listen mode by setting a gate-to-body voltage potential level to a predetermined value or range.

Many modifications and other embodiments of the invention will come to mind to one skilled in the art to which this invention pertains having the benefit of the teachings presented in the foregoing descriptions, and the associated drawings. For example, the Therefore, it is to be understood that the invention is not to be limited to the specific embodiments disclosed. Although specific terms are employed herein, they are used in a generic and descriptive sense only and not for purposes of limitation.

What is claimed is:

1. An ultrasound system, comprising:
an ultrasound transducer;
an ultrasound receiver separated from the ultrasound transducer;
a bi-directional transistor having:
  a body region having a first conductivity type and a channel region;
  first and second doped regions having a second conductivity type opposite the first conductivity type, the first and second doped regions separated by the channel region, the first doped region coupled to the ultrasound transducer, the second doped region coupled to the ultrasound receiver; and
  a gate positioned above the channel region;
a first grounding transistor coupled between the gate of the bi-directional transistor and a voltage supply rail; and
a second grounding transistor coupled between the body region of the bi-directional transistor and the voltage supply rail.

2. The ultrasound system of claim 1, further comprising:
a pulser logic circuit including:
  a pull-up transistor coupled between a second voltage supply rail and the first doped region of the bi-directional transistor; and
  a pull-down transistor coupled between the voltage supply rail and the first doped region of the bi-directional transistor.

3. The ultrasound system of claim 1, further comprising:
a first Zener diode having a first anode coupled between the gate of the bi-directional transistor and a drain of the first grounding transistor, and a first cathode; and
a second Zener diode having a second anode coupled between the body of the bi-directional transistor and a drain of the second grounding transistor, and a second cathode coupled to the first cathode.

4. A control circuit chip comprising:
an ultrasound transducer pin;
an ultrasound receiver pin separated from the transducer pin;
a bi-directional transistor having:
  a body region having a first conductivity type and a channel region;
  first and second doped regions having a second conductivity type opposite the first conductivity type, the first and second doped regions separated by the channel region, the first doped region coupled to the ultrasound transducer, the second doped region coupled to the ultrasound receiver; and
  a gate positioned above the channel region;
a first grounding transistor coupled between the gate of the bi-directional transistor and a voltage supply rail; and
a second grounding transistor coupled between the body region of the bi-directional transistor and the voltage supply rail.

5. The control chip of claim 4, further comprising:
a pulser logic circuit including:
  a pull-up transistor coupled between a second voltage supply rail and the first doped region of the bi-directional transistor; and
a pull-down transistor coupled between the voltage supply rail and the first doped region of the bi-directional transistor.

6. The control chip of claim 4, further comprising:
a first Zener diode having a first anode coupled between the gate of the bi-directional transistor and a drain of the first grounding transistor, and a first cathode; and
a second Zener diode having a second anode coupled between the body of the bi-directional transistor and a drain of the second grounding transistor, and a second cathode coupled to the first cathode.

* * * * *